(12) United States Patent  
Egawa

(10) Patent No.: US 7,898,086 B2  
(45) Date of Patent: Mar. 1, 2011

(54) SEMICONDUCTOR DEVICE HAVING A PACKAGE BASE WITH AT LEAST ONE THROUGH ELECTRODE

(75) Inventor: Yoshimi Egawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/360,570

(22) Filed: Feb. 24, 2006

(65) Prior Publication Data

US 2006/0202347 A1    Sep. 14, 2006

(30) Foreign Application Priority Data

Feb. 28, 2005  (JP) .................................. 2005-053918

(51) Int. Cl.
*H01L 29/40* (2006.01)
(52) U.S. Cl. ..................... 257/774; 257/686; 257/E23.01
(58) Field of Classification Search .......... 257/664–665, 257/734–786, E29.111–29.165, E23.01–23.079, 257/E23.141–23.179, 499
See application file for complete search history.

(56) References Cited

U.S. PATENT DOCUMENTS

| | | | |
|---|---|---|---|
| 6,809,421 B1 | 10/2004 | Hayasaka et al. | |
| 7,579,553 B2 * | 8/2009 | Moriizumi | 174/260 |
| 2004/0080013 A1 | 4/2004 | Kimura et al. | |
| 2005/0014311 A1 | 1/2005 | Hayasaka et al. | |
| 2005/0051883 A1 * | 3/2005 | Fukazawa | 257/686 |

FOREIGN PATENT DOCUMENTS

| | | | |
|---|---|---|---|
| JP | 60-140850 | | 7/1985 |
| JP | 07-235631 | * | 9/1995 |
| JP | 7-235631 | | 9/1995 |
| JP | 9-102559 | | 4/1997 |
| JP | 10-223833 | | 8/1998 |
| JP | 2001189234 | * | 7/2001 |
| JP | 2002-43502 | | 2/2002 |
| JP | 2003-068857 | * | 3/2003 |
| JP | 2003-68857 | | 3/2003 |
| JP | 2005-33105 | | 2/2005 |
| JP | 2006-19455 | | 1/2006 |

* cited by examiner

*Primary Examiner* — Quoc D Hoang  
*Assistant Examiner* — Tony Tran  
(74) *Attorney, Agent, or Firm* — Rabin & Berdo PC

(57) ABSTRACT

A through electrode extends through a silicon substrate from the upper surface to the lower surface of the substrate to accomplish electrical conduction between the upper and lower surfaces of the substrate. The through electrode includes a plurality of slender through holes formed in a through electrode forming area of the silicon substrate. The slender through holes extend through the silicon substrate from the upper surface to the lower surface of the silicon substrate. The through electrode also includes a plurality of conductive bodies fitted in the slender through holes. The conductive bodies are electrically connected with each other.

20 Claims, 12 Drawing Sheets

(P1)

(P2)

(P3)

(P4)

(P5)

(PA1)

(PA2)

(PA3)

(PA4)

(PA5)

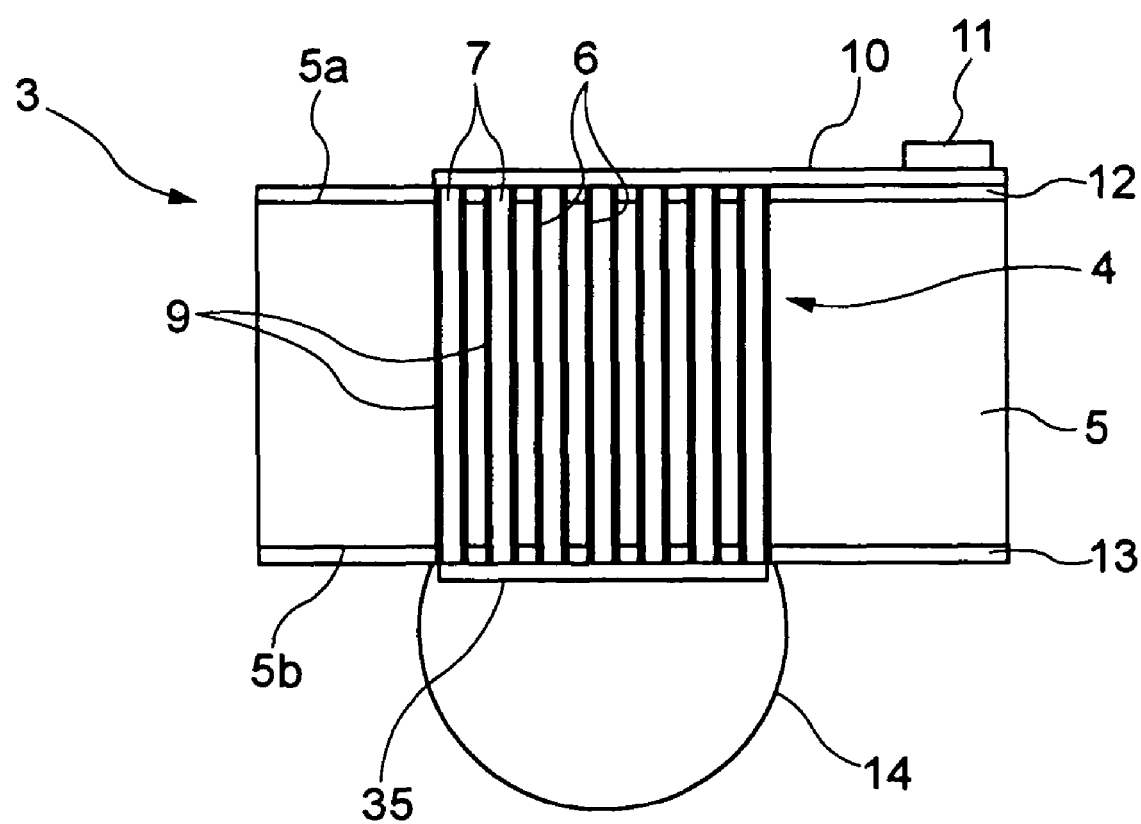

(PB1)

(PB2)

(PB3)

(PB4)

(PB5)

(PC1)

(PC2)

(PC3)

(PC4)

(PC5)

(PC6)

(PC7)

(PC8)

(PZ1)

(PZ2)

(PZ3)

(PZ4)

(PZ5)

US 7,898,086 B2

SEMICONDUCTOR DEVICE HAVING A PACKAGE BASE WITH AT LEAST ONE THROUGH ELECTRODE

BACKGROUND OF THE INVENTION

1. Field of the Invention

The present invention relates to a through electrode extending through a silicon substrate of a semiconductor chip, a package base or the like, for accomplishing electrical conduction between the upper and lower surfaces of the silicon substrate. The present invention also relates to a method of manufacturing such through electrode. The present invention also relates to a package base and a semiconductor chip having the through electrode(s).

2. Description of the Related Art

One example of conventional through electrodes is a through electrode made through a plurality of semiconductor chips stacked as a single semiconductor package. This through electrode is fabricated by the following way. A silicon (Si) substrate of a semiconductor wafer has a through electrode formation area. A mask pattern is formed on the substrate other than the through hole formation area. The through electrode forming area is an exposed area and etched by dry etching to form an electrode forming hole having a bottom. The bottom surface and the side surface (hereinafter, referred to as the "inner surface") of the electrode forming hole are coated with an insulating film, which is made of silicon dioxide ($SiO_2$), by chemical vapor deposition (CVD). Subsequently, a conductive body, which is made of conductive metal, is embedded in the electrode forming hole by plating, and the lower surface of the silicon substrate is polished to expose the conductive body at the bottom of the electrode forming hole. As a result, the through electrode extends from the upper surface to the lower surface of the silicon substrate to accomplish electrical conduction between the upper surface and the lower surface of the silicon substrate. Such through electrode is disclosed in Japanese Patent Application Kokai (Laid Open) No. 10-223833. In particular, see page 6, paragraph 0061 to page 7, paragraph 0082, and FIGS. 4 and 5.

The method of manufacturing the through electrode disclosed in JP 10-223833 may be used as a method of manufacturing a through electrode for accomplishing electrical conduction between the upper and lower surfaces of a package base used in a semiconductor package.

FIG. 13 of the accompanying drawings is a cross-sectional view illustrating a conventional semiconductor package, and FIG. 14 of the accompanying drawings is a plan view of a conventional package base.

Referring to FIGS. 13 and 14, a semiconductor package 101 will be described. A plurality of semiconductor chips 104 are stacked one on another on a package base 105. Each semiconductor chip 104 has through electrodes 102 formed in a chip substrate 103, which is a silicon substrate. The through electrodes 102 of each semiconductor chip 104 are joined with each other by bumps 106 such that the through electrodes 102 of the semiconductor chip 104 are electrically connected with each other. Between the respective semiconductor chips 104 are disposed under-fills 107 to accomplish the insulation between the semiconductor chips 104.

An upper insulating layer 111 is formed on the upper surface 110a of a base substrate 110. The base substrate 110 is a silicon substrate of the package base 105. A rerouting wire 112 made of conductive material is formed on the upper insulating layer 111. The through electrodes 102 of the lowest-layer semiconductor chip 104 are joined with the rerouting wire 112 by the bumps 106 such that the through electrodes 102 are electrically connected to the rerouting wire 112. Through holes 113 are formed in the base substrate 110 from the upper surface 110a thereof to the lower surface 110b thereof. Each through hole 113 has a relatively large inner diameter (for example, Φ 300 μm), and is filled with a conductive body 114 made of copper (Cu) or silver (Ag) so that a through electrode 115 is made. External terminals 116 made of tin-lead alloy (SnPb) or tin-silver alloy (SnAg) are joined to the lower ends of the through electrodes 115. The rerouting wire 112 is electrically connected with the external terminals 116 via the through electrodes 115. The external terminals 116 are connected to wiring terminals of a mounting substrate (not shown). Thus, the stacked semiconductor chips 104 are electrically connected to the mounting substrate via the package base 105.

An insulating layer 120 is formed on the lower surface 110b of the base substrate 110 excluding the external terminals 116. Consequently, the insulation between the base substrate and the mounting substrate is ensured.

FIGS. 15A to 15E of the accompanying drawings is a series of cross-sectional views illustrating a conventional package base manufacturing method.

Referring to FIG. 15A, an electrode forming hole 117 is formed in the upper surface 110a of the base substrate 110 such that the electrode forming hole 117 has a bottom. The electrode forming hole 117 will later become a through hole 113.

As shown in FIGS. 15B and 15B, an insulating film 118 made of silicon dioxide is formed on the inner surface of each electrode forming hole 117 to electrically insulate the conductor body 114 and the base substrate 110 from each other.

A mask pattern 125 (FIG. 15A) is made of a suitable material (e.g., silicon dioxide) to obtain satisfactory etching selectivity (etching depth ratio) to silicon at the time of dry etching.

The conventional package base manufacturing method will be described based on processes PZ1 (FIG. 15A) to PZ5 (FIG. 15E).

At the process PZ1 (FIG. 15A), columnar silicon is sliced to form a silicon substrate, i.e., a base substrate 110. Thereafter, a mask pattern 125 is applied to the upper surface 110a of the base substrate 110 except for the through electrode forming area (in this example, the area where a through hole 113 will be formed and having the same diameter as the through hole 113), and the through electrode forming area is dry-etched to form an electrode forming hole 117 having a bottom.

At the process PZ2 (FIG. 15B), the mask pattern 125 is removed, and an upper face insulating layer 111 and an insulating film 118, both of which are made of silicon dioxide, are formed, by CVD, on the upper surface 110a of the base substrate 110 and on the inner surface of the electrode forming hole 117, respectively.

At the process PZ3 (FIG. 15C), a conductive body 114 is embedded in the electrode forming hole 117 by a plating process, such as electrolytic plating or inelectrolytic plating, such that the inner volume of the electrode forming hole 117 is filled with the conductive body 114.

At the process PZ4 (FIG. 15D), a resist mask is formed on the upper insulating layer 111 by lithography to mask the upper insulating layer 111 except for a rerouting wire forming area where a rerouting wire 112 will be formed. The rerouting wire 112 extends from the top of the conductive body 114 of the electrode forming hole 117 to a bump forming area where a bump 106 connected to a through electrode 115 will be formed. The through electrode is formed by the conductive body 114. Then, the rerouting wire 112 is formed from the top of the through electrode 115 to the bump 106 on the exposed upper insulating layer 111 by the plating. Subsequently, the resist mask is removed, and the bump 106 is formed at the bump forming area of the rerouting wire 112.

At the process PZ5 (FIG. 15E), the lower surface 110b of the base substrate 110 is removed by mechanical grinding or chemical mechanical polishing (CMP) until the conductive body 114 is exposed at the lower surface 110b of the base substrate 110. A lower insulating layer 120 is formed on the polished lower surface 110b of the base substrate 110 by CVD.

Subsequently, an external terminal 116 is joined to the exposed lower end of the conductive body 114. As a result, the conductive body 114, which is embedded in the through hole 113, serves as the through electrode 115 to establish electrical conduction between the upper surface 110a and the lower surface 110b of the base substrate 110.

Thereafter, a wafer is divided into pieces to form a plurality of package bases 105.

In the conventional package base manufacturing method as described above, the through electrode is formed by embedding the conductive body in the electrode forming hole, which is provided to form the through electrode, using a plating process. Filling the electrode forming hole with the conductive body is time consuming, and therefore, the manufacturing efficiency of the through electrode manufacturing process is low.

This problem is especially serious in manufacturing a package base whose electrode forming hole has a relatively large inner diameter because this large hole should be filled with the conductive body.

In order to reduce the time necessary to embed the conductive body in the electrode forming hole, it could be possible that the diameter of the electrode forming hole is decreased to form a slender through hole. In this case, however, the joining strength between the through electrode and the semiconductor chip (or the bump) and between the through electrode and the external terminal of the package base is reduced. Consequently, decreasing the diameter of the electrode forming hole is not preferable.

SUMMARY OF THE INVENTION

One object of the present invention is to ensure appropriate joining strength between the through electrode and the external terminal and between the through electrode and the bump while reducing the time necessary to embed the conductive body in the electrode forming hole.

According to one aspect of the present invention, there is provided a through electrode extending through a silicon substrate from the upper surface to the lower surface thereof to accomplish electrical conduction between the upper and lower surfaces of the silicon substrate. The through electrode includes a plurality of slender through holes formed in a through electrode forming area of the silicon substrate such that the slender through holes extend through the silicon substrate from the upper surface to the lower surface of the silicon substrate. The through electrode also includes a plurality of conductive bodies embedded in the slender through holes, respectively. The conductive bodies are electrically connected with each other.

The inner volume of the electrode forming hole, in which the conductive body is embedded, is decreased, and therefore, the time necessary to embed the conductive body in the electrode forming hole is reduced. Consequently, the manufacturing efficiency of the through electrode manufacturing process is improved.

Furthermore, because an external terminal is joined to a through electrode unit constituted by a plurality of slender electrodes, decent joining strength between the external terminal and the through electrode unit is ensured.

BRIEF DESCRIPTION OF THE DRAWINGS

The above and other objects, aspects, features and advantages of the present invention will be more clearly understood from the following detailed description taken in conjunction with the accompanying drawings, in which:

FIG. 8 is a partial cross-sectional view of a package base according to a third embodiment of the present invention;

DETAILED DESCRIPTION OF THE INVENTION

Now, embodiments of the present invention will be described in detail with reference to the accompanying drawings.

First Embodiment

Figure 1:
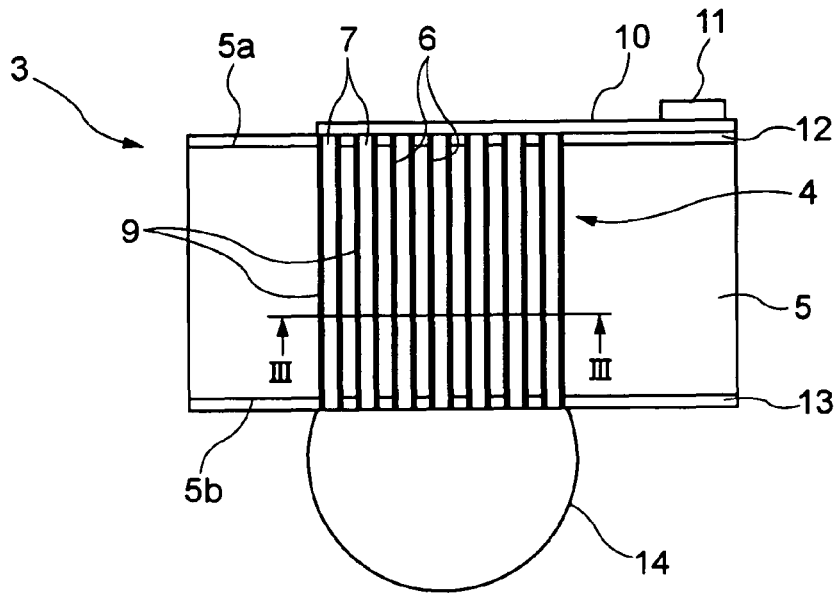
FIG. 1 is a partial cross-sectional view of a package base according to a first embodiment of the present invention.
Figure 2:
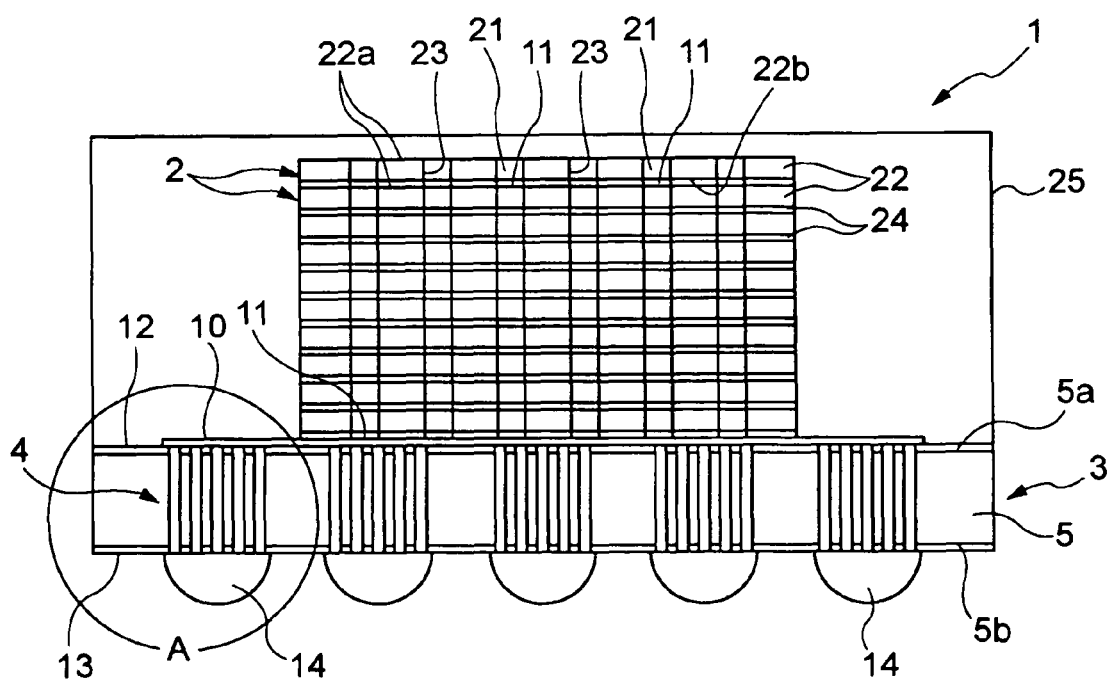
FIG. 2 is a cross-sectional view of a semiconductor package according to the first embodiment.
Figure 3:
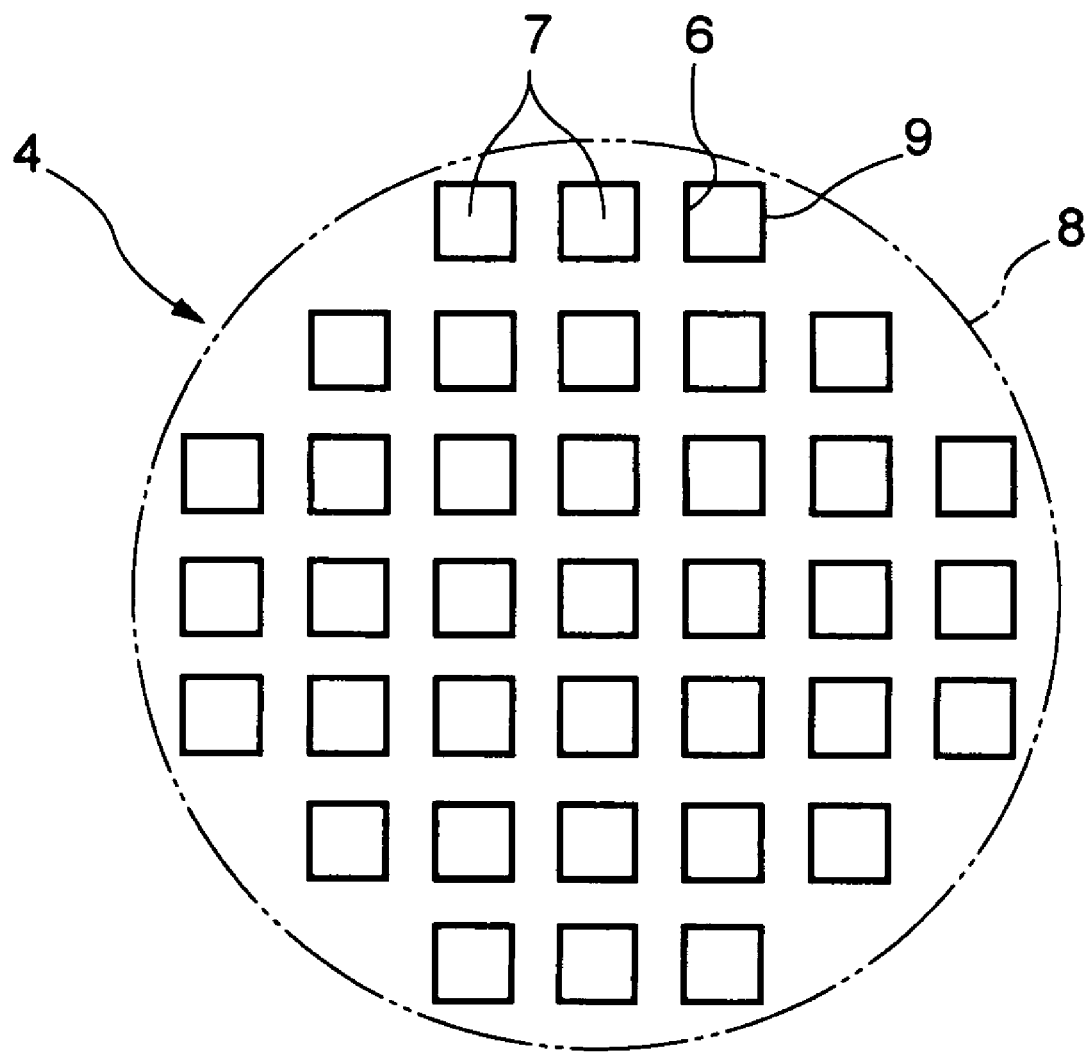
FIG. 3 is a cross-sectional view taken along the line III-III in FIG. 1.

Referring to FIG. 1 to FIG. 3, a through electrode and a method of making the through electrode according to a first embodiment will be described. FIG. 1 is an enlarged view of part A in FIG. 2.

Referring to FIG. 2, a semiconductor package 1 includes a plurality of semiconductor chips 2 stacked one on another on a package base 3.

In FIG. 2, a plurality of through electrode units 4 are provided in the package base 3. Each through electrode unit 4 includes a plurality of slender conductive bodies 7 made of copper or silver. The conductive bodies 7 are embedded in a plurality of slender through holes 6 formed through a silicon substrate (i.e., base substrate) 5 of the package base 3 from the upper surface 5a to the lower surface 5b of the base substrate 5, respectively. The through electrode units 4 establish electrical conduction between the upper surface 5a and the lower surface 5b of the base substrate 5.

The through holes 6 have a square cross-sectional shape having a width of 5 to 30 μm or a circular cross-sectional shape having a diameter of 5 to 30 μm. The through holes 6 are provided in each of through electrode forming areas 8. FIG. 3 shows one through electrode forming area 8 by a two-dot chain line.

Each through electrode forming area 8 is a circular area and has a diameter approximately equal to that of an external terminal 14. Each through electrode forming area 8 is located at the position where the associated through electrode unit 4 is formed.

Insulating films 9 made of silicon dioxide are also provided in the through holes 6. Each insulating film 9 is disposed between the side wall of each through hole 6 and the corresponding conductive body 7 for electrically insulating the conductor body 7 and the base substrate 5 from each other. In FIGS. 1 and 3, the insulating films 9 are shown by a solid bold line.

A rerouting wire 10 is constituted by a wiring pattern formed on the upper surface 5a of the base substrate 5. The rerouting wire 10 has one end joined to the upper surface of the through electrode unit 4 and the other end joined to a bump 11. The bump 11 is formed at a bump forming area and joined to a conductive plug 21 of the semiconductor chip 2 connected to the through electrode unit 4. Consequently, the through electrode unit 4 and the bump 11 are electrically connected by the rerouting wire 10.

The bump 11 is formed by applying a bump material containing nickel (Ni) and gold (Au) in a paste state at the bump forming area on the rerouting wire 10 by potting, and then thermally hardening the applied bump material. The bump material may contain copper and tin-silver alloy, instead of nickel and gold. Alternatively the bump material may contain copper alone.

An upper face insulating layer 12 made of insulating material, such as silicon dioxide or silicon nitride ($Si_3N_4$), is formed on the upper surface 5a of the base substrate 5 except for the upper ends of the conductor bodies 7. The upper insulating layer 12 electrically insulates the rerouting wire 10 and the base substrate 5 from each other.

A lower face insulating layer 13 made of an insulating material, such as silicon dioxide or silicon nitride, is formed on the lower surface 5b of the base substrate 5 except for the lower ends of the conductor bodies 7. The lower insulating layer 13 electrically insulates a mounting substrate (not shown) and the base substrate 5 from each other.

A plurality of external terminals 14 are provided on the lower surface 5b of the base substrate 5. Each external terminal 14 is made of tin-lead alloy or tin-silver alloy, and has a relatively large inner diameter (for example, approximately Φ 300 μm). The external terminal 14 is joined to the lower ends of the conductive bodies 7 of each through electrode unit 4. The external terminals 14 are located at the positions corresponding to wire terminals of the mounting substrate (not shown) to electrically connect the semiconductor package 1 to the mounting substrate.

It should be noted that the lower insulating layer 13 may be omitted so long as the electrical insulation between the mounting substrate and the base substrate 5 is not affected.

Also, the upper surface 5a of the base substrate 5 excluding the bumps 11 may be coated with a coating material, such as polyimide, as occasion demands, to protect the rerouting wire 10 and electrically insulate the rerouting wire 10 from the semiconductor chip 2.

Referring to FIG. 2, conductive plugs 21 serve as through electrodes of each semiconductor chip 2. Each conductive plug 21 is formed by embedding the conductive body 7 in each chip through hole 23 extending through the semiconductor chip 2 from the upper surface 22a of the silicon substrate (i.e., chip substrate) 22 of each semiconductor chip 2 to the lower surface 22b of the chip substrate 22. Circuit elements are formed on the chip substrate upper surface 22a. Circuit elements are not formed on the chip substrate lower surface 22b. The electrical conduction between the upper and lower surfaces 22a and 22b of the chip substrate 22 is accomplished by the conductive plugs 21.

The bumps 11 are directly provided at the upper ends of the conductive plugs 21 embedded in each of the chip substrates 22 below the uppermost chip substrate 22.

Under-fills 24 are formed between each two semiconductor chips 2 and between the lowest semiconductor chip 2 and package substrate 3. Each under-fill 24 is created by injecting an under-filling material, such as epoxy resin, between the respective semiconductor chips 2 and between the lowermost semiconductor chip 2 and the package base 3, excluding the bumps 11, and thermally hardening the injected under-fill material. The protection and electrical insulation between the respective semiconductor chips 2 are accomplished by the under-fills 24.

An over-mold 25 is formed by providing a molding material, such as epoxy resin, over the upper surface 3a of the package base 3. The molding material encloses (buries) the stacked semiconductor chips 2 and is thermally hardened. The over-mold 25 serves to protect the semiconductor chips 2 and the rerouting wires 10 from the outside.

The over-mold 25 is formed by transfer molding. Specifically, the semiconductor chips 2 are stacked on a plurality of package bases 3 formed on a wafer, or the wafer is divided into a plurality of elongated rectangle shapes having a plurality of package bases 3, and then the semiconductor chips 2 are stacked on the package bases 3. Subsequently, the semiconductor chips 2 stacked on the package bases 3 are placed in a mold having a predetermined size, and the mold is filled with the molding material to form the over-mold 25.

When the semiconductor chips 2 are stacked one on another on the package base 3 and then joined to the package base 3, the lower ends of the conductive plugs 21 of the lowermost (first) semiconductor chip 2 are aligned with the bumps 11 on the rerouting wires 10 of the package base 3, and then the lower ends of the conductive plugs 21 of the next (second) semiconductor chip 2 are aligned with the bumps 11 on the upper ends of the conductive plugs 21 of the lowermost semiconductor chip 2. This aligning and stacking is repeated for subsequent semiconductor chips 2. Then, the bumps 11 are melted by heat to join the conductive plugs 21 of the semiconductor chips 2, and, at the same time, to join the conductive plugs 21 to the rerouting wires 10 of the package base 3. Consequently, the conductive plugs 21 of each semiconductor chip 2 and the external terminals 14 of the package base 3 are electrically connected with each other, and the conductive plugs 21 disposed at a narrow interval are electrically connected to the wire terminals of the mounting substrate (not shown), which are disposed at a relatively wide interval, via the external terminals 14.

FIGS. 4A to 4E are sectional views illustrating a package base manufacturing method according to a first embodiment of the present invention.

Figure 4A:
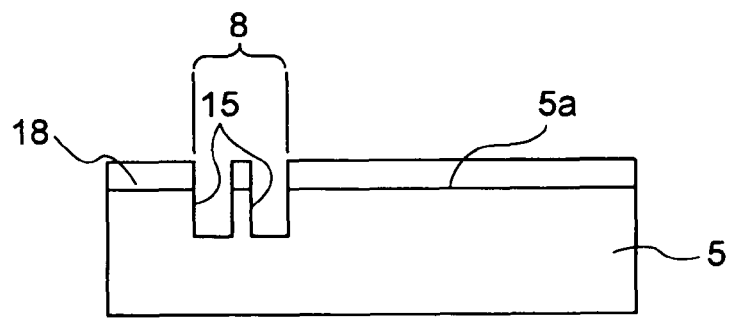
FIGS. 4A to 4E are a series of cross-sectional views illustrating a package base manufacturing method according to the first embodiment.
Figure 4B:
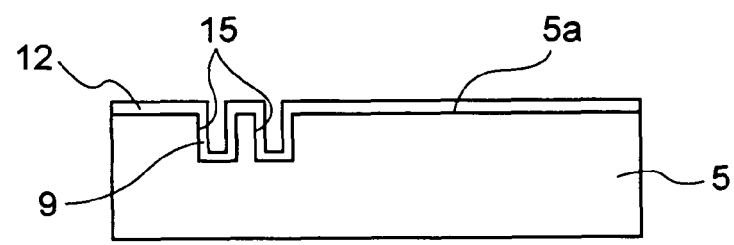
Figure 4C:
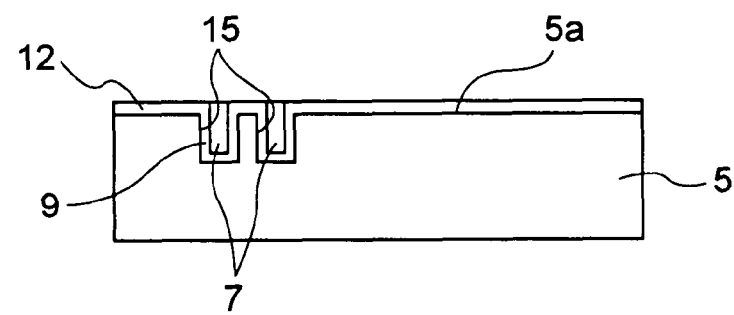
Figure 4D:
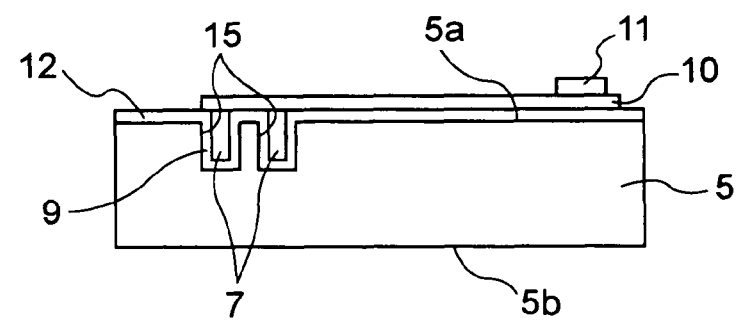

Referring to FIG. 4A, a plurality of slender electrode forming holes 15 which will later become the slender through holes 6 are formed in the upper surface 5a of the base substrate 5. Each slender electrode forming hole 15 has a bottom.

The depth of each electrode forming hole 15 is not less than 7% and not greater than 27% of the thickness of the base substrate 5. Preferably, the depth of the narrow electrode forming hole 15 is approximately 20% of the thickness of the base substrate 5. If the depth of the electrode forming holes 15 is less than 7% of the thickness of the base substrate 5, the thickness of the base substrate 5 becomes excessively small as the base substrate 5 is thinned at the process P5, and therefore, the strength of the package substrate 1 is significantly reduced. If the depth of the electrode forming hole 15 is greater than 27% of the thickness of the base substrate 5, the ratio of the inner diameter to the depth of the electrode forming hole 15 is excessively increased, and therefore, it becomes difficult to form an insulating film 9 at the process P2. Thus, it is preferred that the depth of each electrode forming hole 15 be approximately 20% of the thickness of the base substrate 5.

A mask pattern 18 is similar to the mask pattern 125.

Figure 4E:
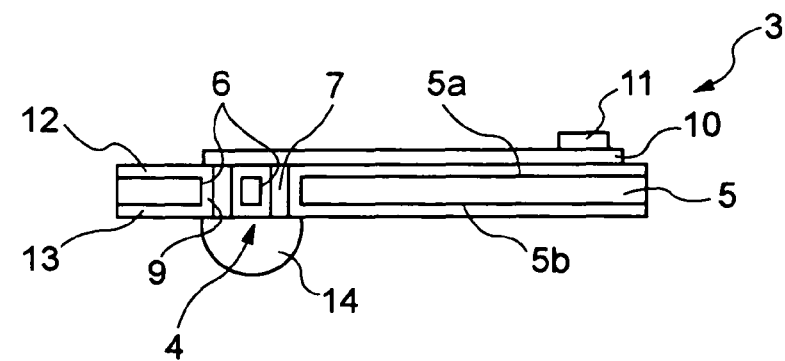

Now, the package base manufacturing method according to the first embodiment of the present invention will be described based on the processes P1 (FIG. 4A) to P5 (FIG. 4E).

At the process P1 (FIG. 4A), columnar silicon is sliced to form a silicon substrate, i.e., a base substrate 5. Thereafter, a mask pattern 18 is applied to the upper surface 5a of the base substrate 5 except for through hole forming areas of the through electrode forming areas 8, and the through electrode forming areas 8 are dry-etched to form the electrode forming holes 15 having a predetermined depth.

The electrode forming holes 15 may be formed by laser. The laser makes it possible to directly form the electrode forming holes 15 in the base substrate 5 without using the mask pattern 18.

At the process P2 (FIG. 4B), the mask pattern 18 is removed, and an upper insulating layer 12 and an insulating film 9, both made of silicon dioxide, are formed on the upper surface 5a of the base substrate 5 and on the inner walls of the electrode forming holes 15, respectively, by CVD.

At the process P3 (FIG. 4C), conductive bodies 7 are embedded in the electrode forming holes 15, such that the inner volumes of the electrode forming holes 15 surrounded by the insulating film 9 are filled with the conductive bodies, by plating.

At the process P4 (FIG. 4D), a resist mask is formed on the upper insulating layer 12 by lithography to mask the upper insulating layer 12 except for a rerouting wire forming area. The rerouting wire 10 is formed on the exposed part of the upper insulating layer 12 by the plating such that the rerouting wire 10 extends from the top of the through electrode unit 4 to the bump 11.

Subsequently, the resist mask is removed by a detaching agent, and then a bump material 10 is applied to the bump forming area on the rerouting wire 10 by potting. After that, the bump material 10 is thermally hardened. As a result, the bump 11 is formed.

At the process P5 (FIG. 4E), the lower surface 5b of the base substrate 5 is removed by mechanical grinding or chemical mechanical polishing (CMP), and the base substrate 5 is thinned such that the conductive bodies 7 are exposed at the lower surface 5b of the base substrate 5. A lower insulating layer 13, which is made of silicon dioxide, is then formed on the lower surface 5b of the base substrate 5 by CVD.

Subsequently, those portions of the lower insulating layer 13, which are formed at the lower ends of the conductive bodies 7, are removed by CMP, and then an external terminal 14 is joined to the exposed lower ends of the conductive bodies 7 by soldering with a tin-lead alloy ball.

As a result, the conductive bodies 7, which are embedded in the through holes 6, constitute the through electrode unit 4 in the first embodiment of the present invention. The through electrode unit 4 serves as a through electrode that establishes electrical conduction between the upper surface 5a and the lower surface 5b of the base substrate 5.

In this way, a wafer having a plurality of package bases 3 is manufactured in the first embodiment.

If the package bases 3 are individually used, the wafer is divided into the individual package bases 3.

If the semiconductor package 1 is manufactured using the wafer having the package bases 3, the lower surfaces of the conductive plugs 21 of the lowermost one of the separately-prepared semiconductor chips 2, which are stacked via the bumps 11, are placed on the bumps 11 of the rerouting wires 10 of the package bases 3, and the bumps 11 are melted by heating. As a result, the conductive plugs of the respective semiconductor chips 2 are joined with each other, and the conductive plugs 21 of the lowermost semiconductor chip 2 and the rerouting wires 10 are also joined with each other.

Subsequently, under-filling materials are injected between the respective semiconductor chips 2, and are then thermally hardened to form the under-fills 24. After that, a molding material is supplied over the upper surface 5a of the base substrate 5 by transfer molding such that the stacked semiconductor chips 5 are buried in the molding material. The molding material is thermally hardened to form the overmold 25.

Thereafter, the wafer is divided into individual package bases 3 to obtain the semiconductor package 1.

As described above, the conductive bodies are embedded in the through holes formed in the upper surface of the base substrate in the first embodiment, and therefore, the total inner volume of the through holes to be filled with the conductive bodies is decreased, and the time necessary to embed the conductive body is reduced. Consequently, the efficiency of the through electrode manufacturing process increases. Also, the external terminal is joined to the through electrode unit constituted by the slender electrodes so that satisfactory joining strength is ensured between the external terminal and the through electrode unit.

Second Embodiment

Figure 5:
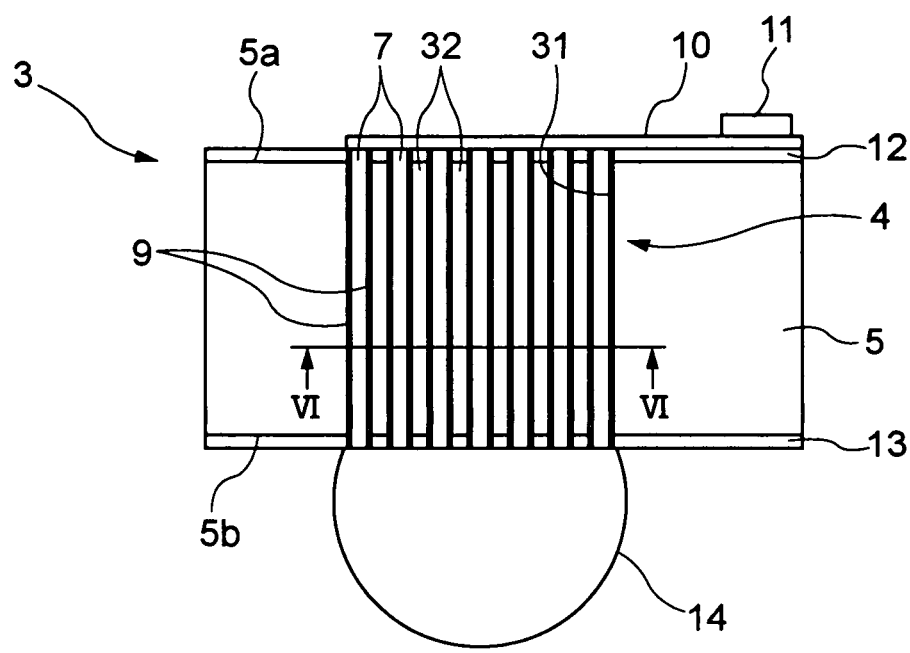
FIG. 5 is a partial cross-sectional view of a package base according to a second embodiment of the present invention.
Figure 6:
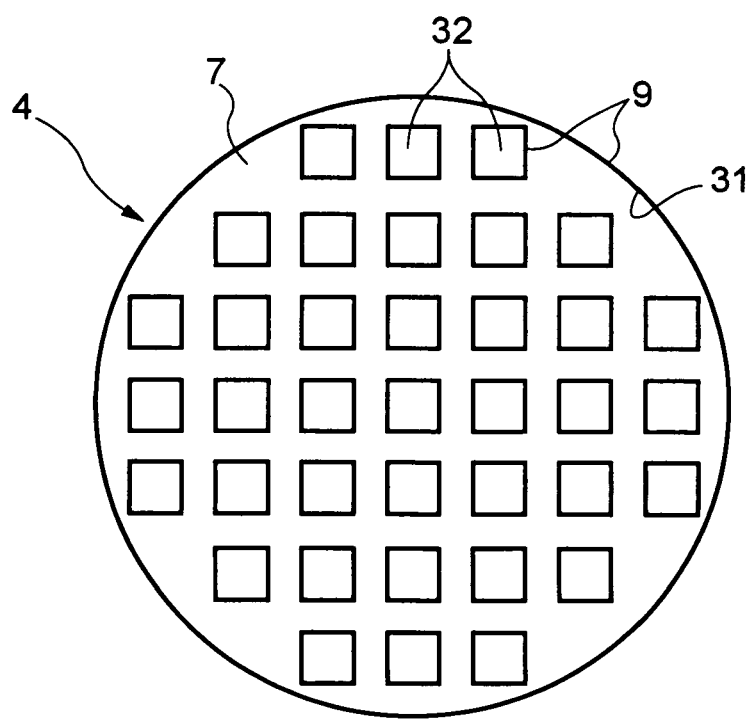
FIG. 6 is a cross-sectional view taken along the line VI-VI in FIG. 5.

FIG. 5 is a partial sectional view illustrating a package base according to a second embodiment of the present invention, and FIG. 6 is a cross-sectional view taken along line VI-VI in FIG. 5.

Components of the package base in the second embodiment, which are identical to those of the package base in the first embodiment, are indicated by the same reference numerals as the first embodiment, and a description thereof will not be given.

Referring to FIGS. 5 and 6, an electrode unit through hole 31 has the same dimension as the electrode forming area 8. In the electrode unit through hole 31 are disposed a plurality of silicon columns 32. Each silicon column 32 has a square sectional shape having a width of 5 to 30 μm or a circular sectional shape having a diameter of 5 to 30 μm. The electrode unit through hole 31 except for the silicon columns 32 is filled with a conductive body 7 to form a lotus root-shaped through electrode unit 4. In FIGS. 5 and 6, insulating films 9 are shown by a solid bold line.

FIGS. 7A to 7E are cross-sectional views illustrating a package base manufacturing method according to the second embodiment of the present invention.

Referring to FIGS. 7A to 7E, an electrode unit forming hole 33 will later become the electrode unit through hole 31. The electrode unit forming hole 33 is formed in the upper surface 5a of the base substrate 5. The electrode unit forming hole 33 has the same depth as the electrode forming holes 15 of the first embodiment, and has a bottom. The silicon columns 32 stand upright from the bottom of the electrode unit forming hole 33.

For the purpose of clarity, only one of the silicon columns 32 is shown in FIGS. 7A to 7E.

Figure 7A:
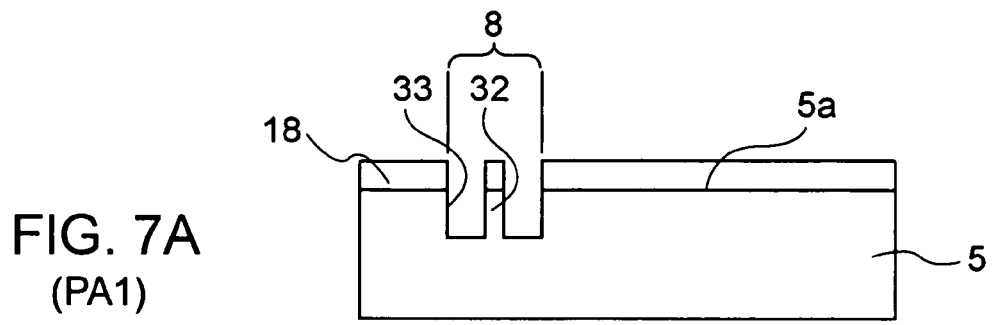
FIGS. 7A to 7E are a series of cross-sectional views illustrating a package base manufacturing method according to the second embodiment.
Figure 7B:
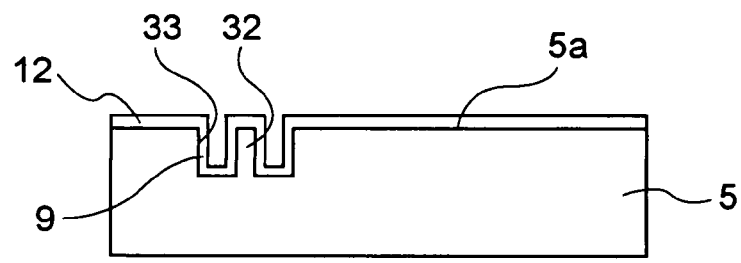
Figure 7C:
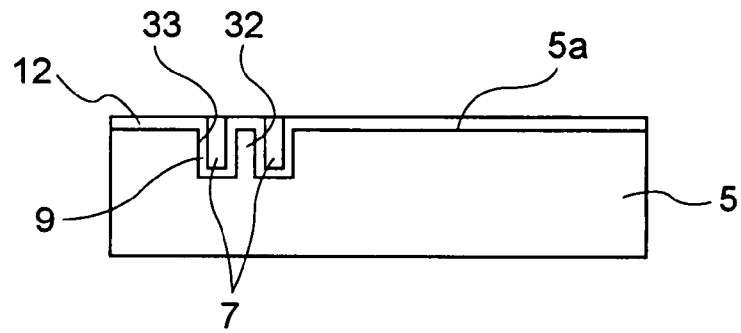
Figure 7D:
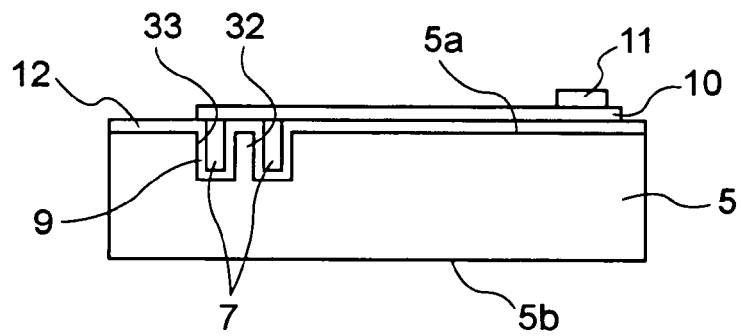
Figure 7E:
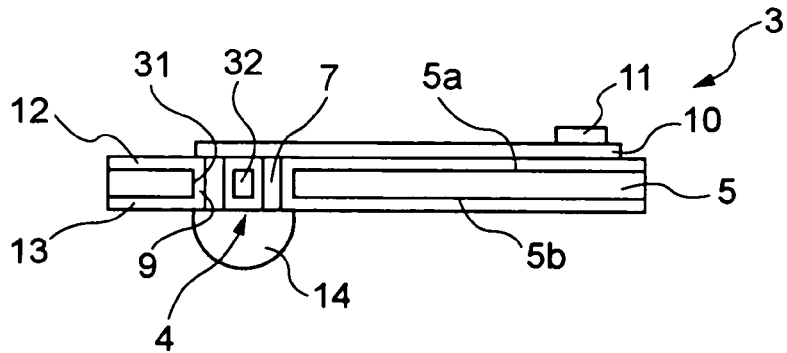

Now, the package base manufacturing method according to the second embodiment will be described based on processes PA1 (FIG. 7A) to PA7 (FIG. 7E).

At the process PA1 (FIG. 7A), a base substrate 5, which is the same as the base substrate formed at the process P1 according to the first embodiment, is prepared. Thereafter, a mask pattern 18 is applied to the upper surface 5a of the base substrate 5 except for a through electrode forming area 8 and also applied to silicon column forming areas in the through electrode forming area 8. The through electrode forming area 8 is dry-etched to form an electrode unit forming hole 33, which has a predetermined depth and has silicon columns 32 standing uprightly on the bottom of the electrode unit forming hole 33.

The electrode unit forming hole 33 may be formed by laser. The laser makes it possible to directly form the electrode unit forming hole 33 in the base substrate 5 without using the mask pattern 18.

At the process PA2 (FIG. 7B), an upper face insulating layer 12 and an insulating film 9 are formed on the upper surface 5a of the base substrate 5, the inner wall of the electrode unit forming hole 33, and the side and top surfaces of the silicon columns 32, respectively, in the same manner as the process P2 of the first embodiment.

At the process PA3 (FIG. 7C), a conductive body 7 is embedded in the electrode unit forming hole 33 in the same manner as the process P3 of the first embodiment. The inner volume of the electrode unit forming hole 33 is filled with the conductive body 7.

At the process PA4 (FIG. 7D), a rerouting wire 10 is formed on the upper insulating layer 12 such that the rerouting wire 10 extends from the top of the through electrode unit 4 to a bump 11, and then the bump 11 is formed. The process PA4 is carried out in the same manner as the process P4 according to the first embodiment of the present invention.

At the process PA5 (FIG. 7E), a lower insulating layer 13 is formed on the lower surface 5b of the base substrate 5, that portion of the lower insulating layer 13, which is formed at the lower end surface of the conductive body 7, is removed, and then an external terminal 14 is joined to the lower end surface of the conductive body 7, in the same manner as the process P5 of the first embodiment.

As a result, the lotus root-shaped conductive body 7, which is formed by providing the silicon columns 32 in the electrode unit through hole 31, constitutes the through electrode unit 4 of the second embodiment. The through electrode unit 4 establishes electrical conduction between the upper surface 5a and the lower surface 5b of the base substrate 5.

In this way, a wafer having a plurality of package bases 3 is manufactured according to the manufacturing method of the second embodiment.

The subsequent processes in the case where the package bases 3 are individually used and in the case where the semiconductor package 1 is manufactured using the wafer having a plurality of package bases 3 are the same as in the first embodiment, and therefore, a description thereof will not be given.

As described above, the second embodiment of the present invention has the same advantages as the first embodiment. In addition, because the through electrode unit is formed in the shape of a lotus root in the second embodiment, the joining area between the through electrode unit and the external terminal is increased, and therefore, the joining strength between the through electrode unit and the external terminal is further enhanced.

Third Embodiment

FIG. 8 is a partial sectional view illustrating a package base according to a third embodiment of the present invention.

Components of the package base according to the third embodiment, which are identical to those of the package base according to the first embodiment, are indicated by the same reference numerals as those of the package base according to the first embodiment, and a description thereof will not be given.

A through electrode unit 4 in the third embodiment is the same as the through electrode unit in the first embodiment.

Referring to FIG. 8, a pad 35 made of copper or nickel and gold is formed in the through electrode forming area 8 such that the lower ends of a plurality of conductive bodies 7 of the through electrode unit 4 are joined with each other by the pad 35. In FIG. 8, insulating films 9 are shown by a solid bold line.

Figure 9A:
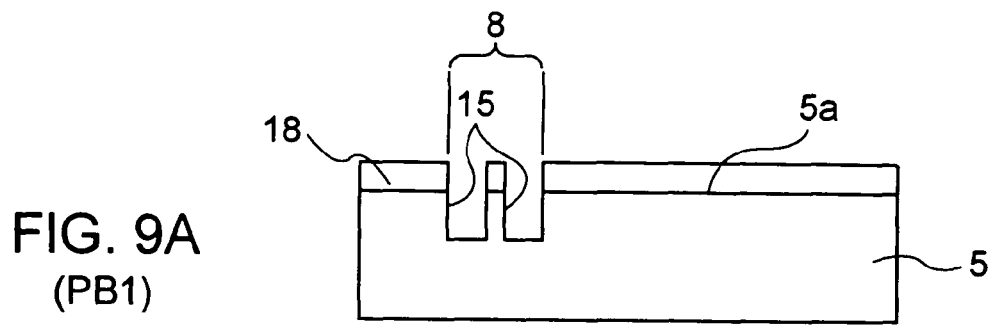
FIGS. 9A to 9E are a series of cross-sectional views illustrating a package base manufacturing method according to the third embodiment.
Figure 9B:
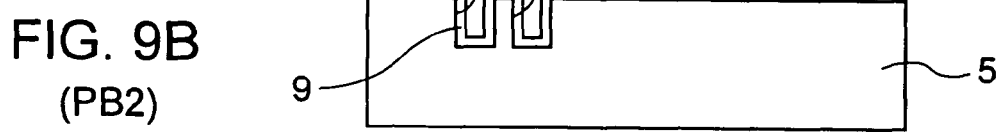
Figure 9C:
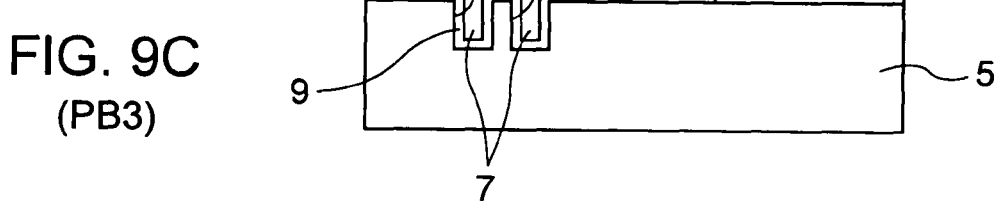
Figure 9D:
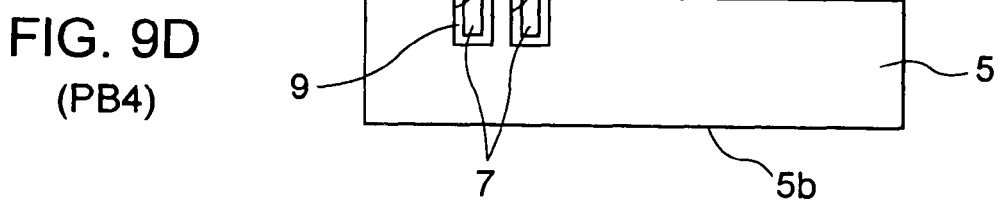
Figure 9E:
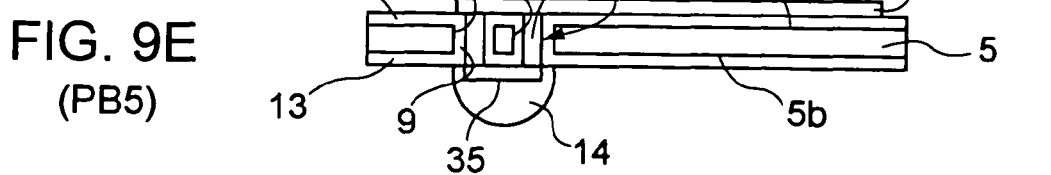

Now, the package base manufacturing method according to the third embodiment of the present invention will be described based on processes PB1 (FIG. 9A) to PB5 (FIG. 9E).

The process PB1 to the process PB4 in the third embodiment are the same as the process P1 to the process P4 in the first embodiment, and therefore, a description thereof will not be given.

At the process PB5 (FIG. 9E), a lower insulating layer 13 is formed on the lower surface 5b of the base substrate 5, and those portions of the lower insulating layer 13, which are formed at the lower ends of the conductive bodies 7, are removed, in the same manner as the process P5 of the first embodiment. Subsequently, a pad 35 is formed over the through electrode forming area 8, including the lower ends of the conductive bodies 7 constituting the through electrode unit 4, by plating, such that the respective conductive bodies 7 are joined to each other by the pad 35, and then an external terminal 14 is joined to the pad 35 in the same manner as the process P5 of the first embodiment.

As a result, the conductive bodies 7, which are embedded in the through holes 6, constitute the through electrode unit 4 in this embodiment of the present invention. The through electrode unit 4 establishes electrical conduction between the upper surface 5a and the lower surface 5b of the base substrate 5. Also, the slim conductive bodies 7 are joined with each other by the pad 35.

In this way, a wafer having a plurality of package bases 3 is manufactured according to the manufacturing method of the third embodiment.

The subsequent processes in the case where the package bases 3 are individually used and in the case where the semiconductor package 1 is manufactured using the wafer having the package bases 3 are the same as in the first embodiment, and therefore, a description thereof will not be given.

As understood from the foregoing, the third embodiment has the same advantage as the first embodiment. In addition, because the narrow conductive bodies are joined with each other by the pad, the joining area between the through electrode unit and the external terminal is increased, and therefore, the joining strength between the through electrode unit and the external terminal is further enhanced.

Fourth Embodiment

Figure 10:
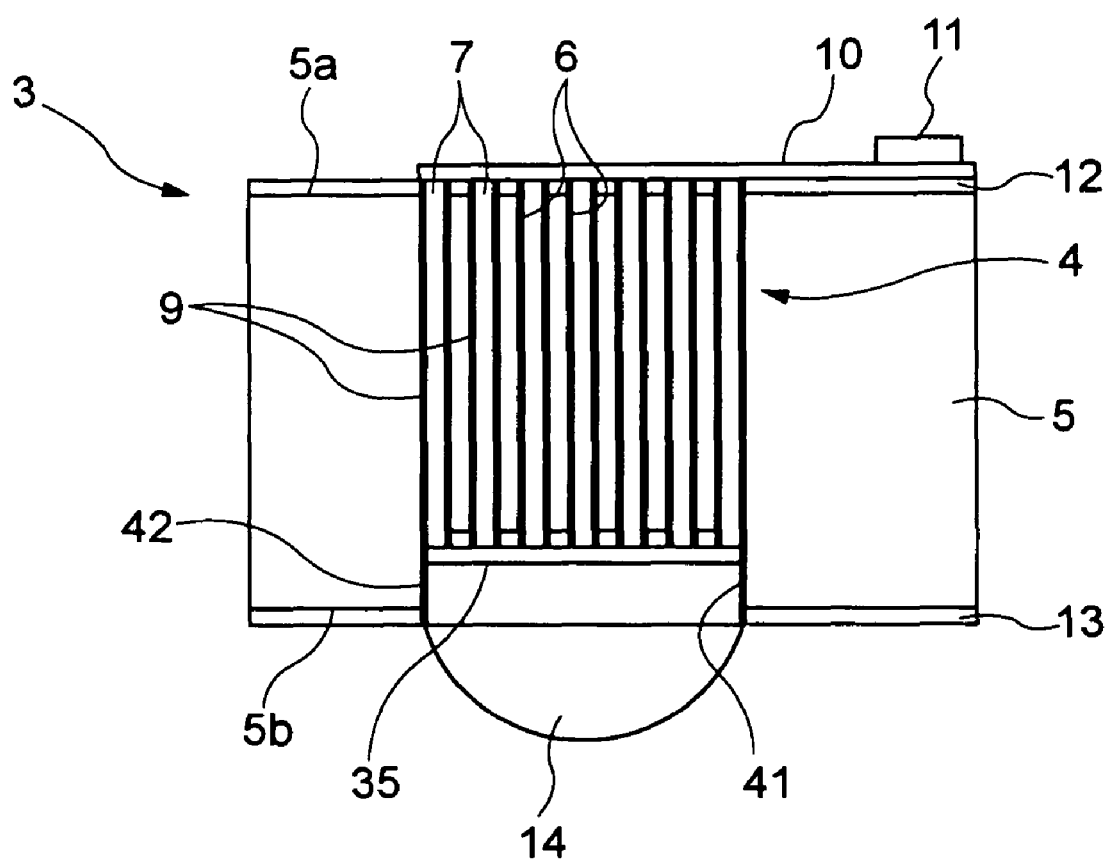
FIG. 10 is a partial cross-sectional view illustrating a package base according to a fourth embodiment of the present invention.

FIG. 10 is a partial cross-sectional view illustrating a package base according to a fourth embodiment of the present invention.

Components of the package base according to the fourth embodiment, which are identical to those of the package bases according to the first and third embodiments, are indicated by the same reference numerals as those of the package base according to the first and third embodiments, and a description thereof will not be given.

A through electrode unit 4 in the fourth embodiment is the same as the through electrode unit in the first embodiment.

Referring to FIG. 10, a depression 41 is formed in the lower surface 5b of the base substrate 5 at the location corresponding to the through electrode forming area 8. The depression 41 exposes the lower surfaces of the narrow conductive bodies 7. The narrow conductive bodies 7 constituting the through electrode 4 is formed in the through electrode forming area 8.

A second insulating film 42 made of silicon dioxide is formed between the side wall of the depression 41 and the pad 35, and between the side wall of the depression 41 and the side surface of the external terminal 14 to electrically insulate the pad 35 and the external terminal 14 from the base substrate 5. In the following description of the fourth embodiment, the insulation films 9 described in the first embodiment will be referred to as the first insulation films 9.

In FIG. 10, the first insulating films 9 and the second insulating film 42 are shown by a solid bold line.

Figure 11A:
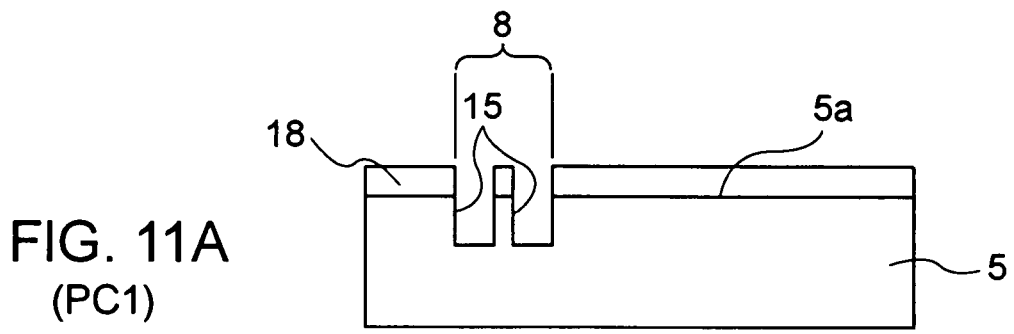
FIGS. 11A to 11E and FIGS. 12A to 12C are a series of cross-sectional views illustrating a package base manufacturing method according to the fourth embodiment.
Figure 11B:
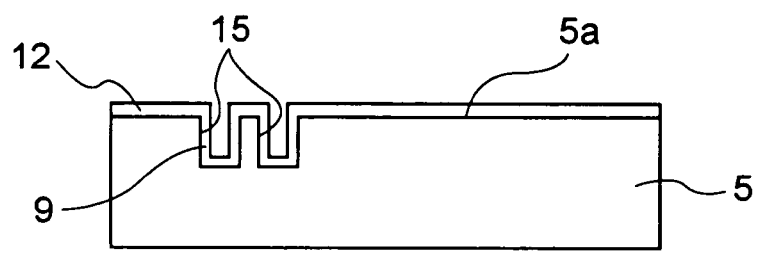
Figure 11C:
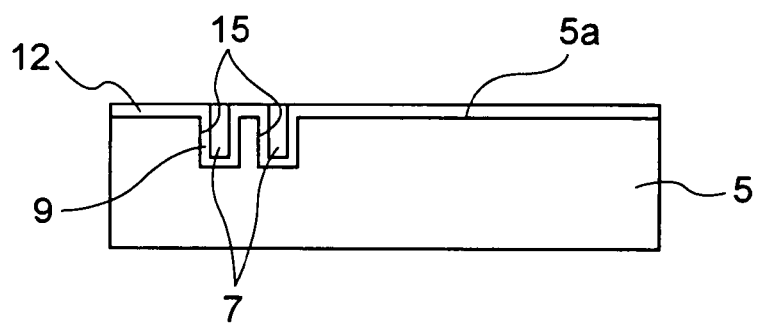
Figure 11D:
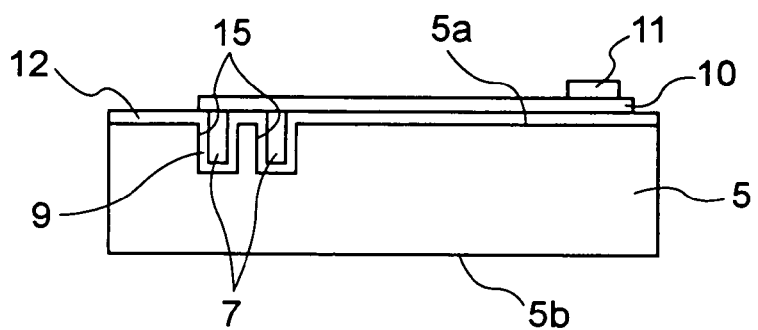
Figure 12A:
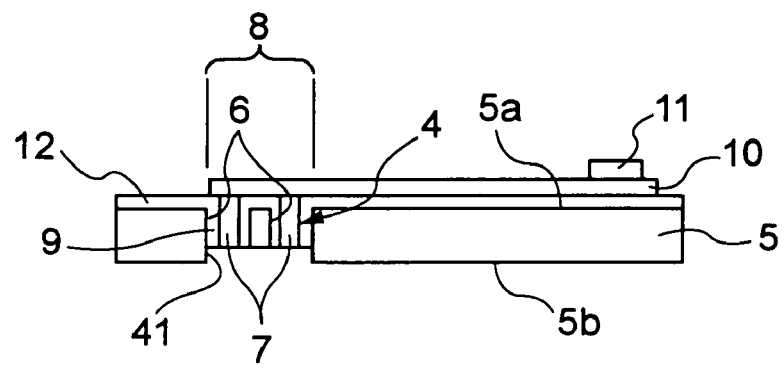
Figure 12B:
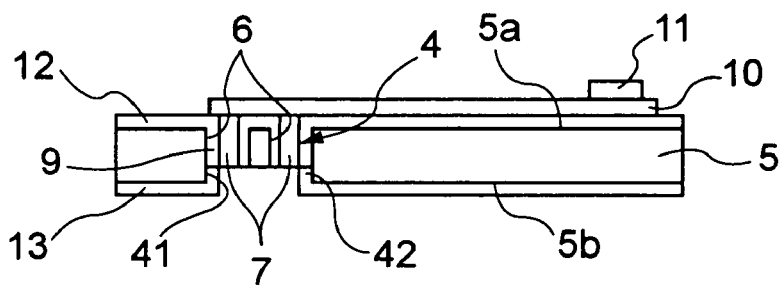
Figure 12C:
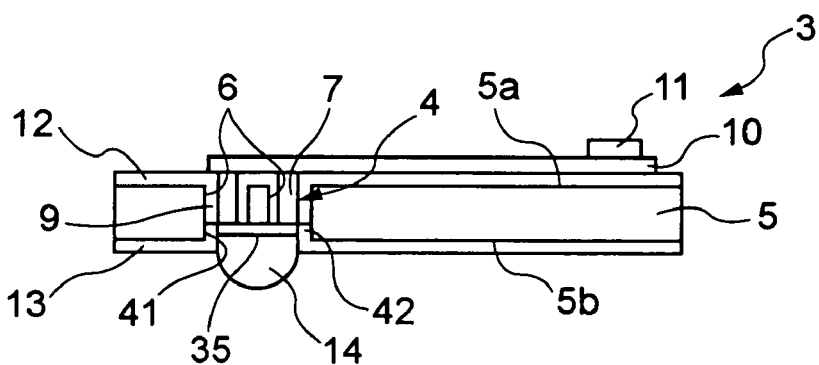
Figure 13:
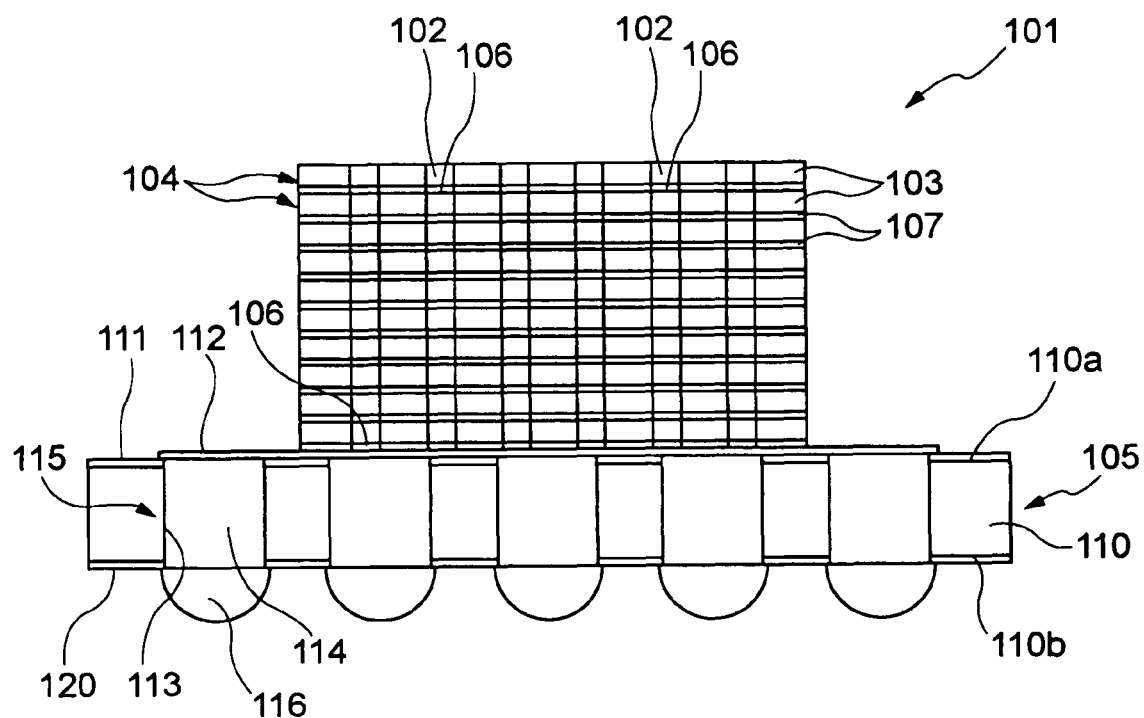
FIG. 13 is a cross-sectional view of a conventional semiconductor package.
Figure 14:
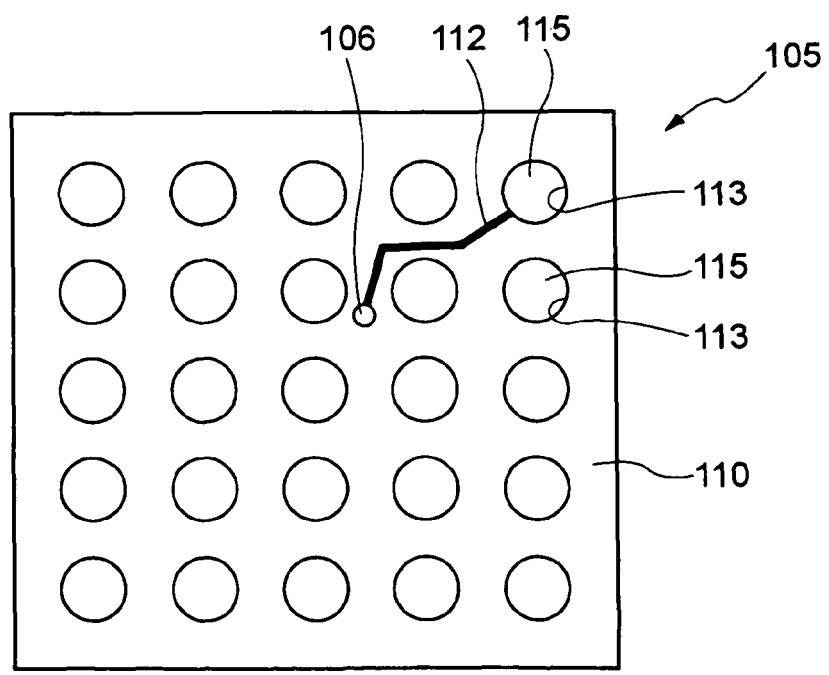
FIG. 14 is a plan view of a conventional package base.
Figure 15A:
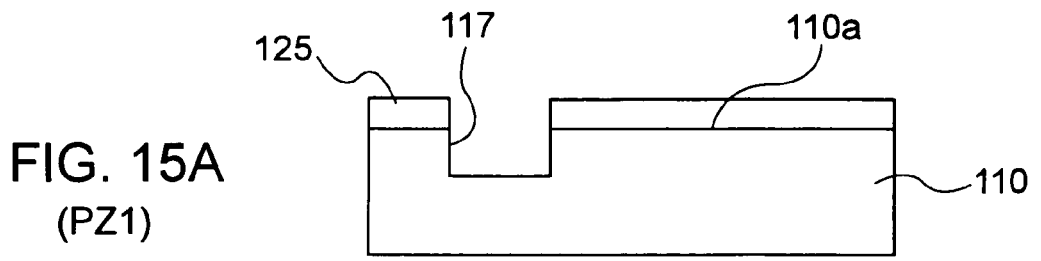
FIGS. 15A to 15E are a series of cross-sectional views illustrating a conventional package base manufacturing method.
Figure 15B:
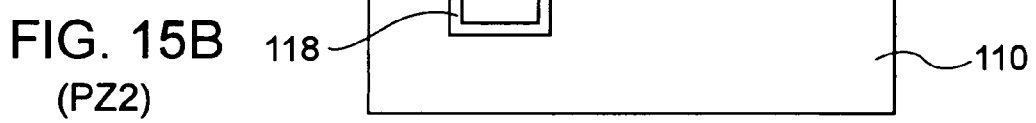
Figure 15C:
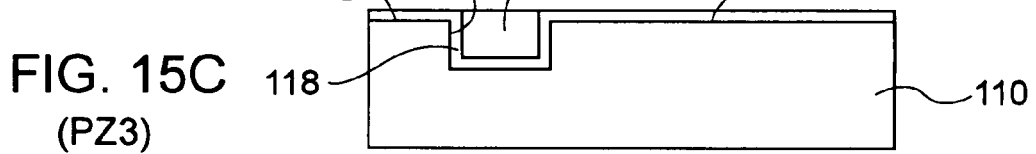
Figure 15D:
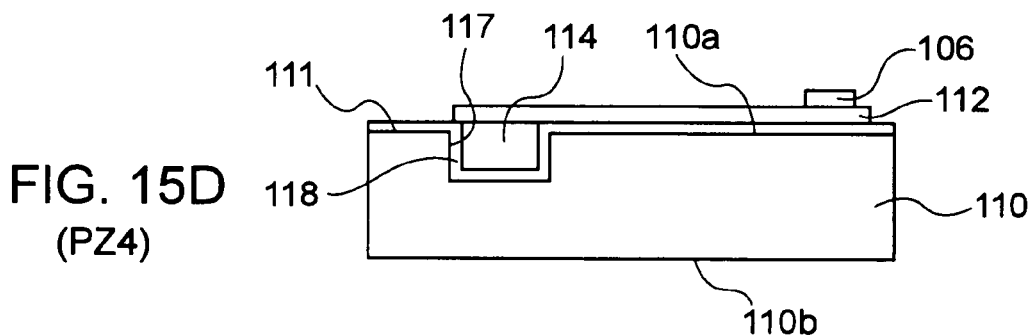
Figure 15E:
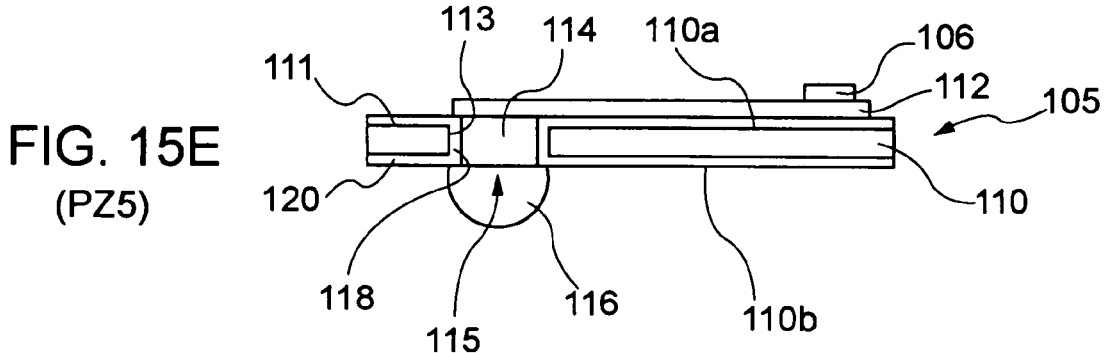

Now, the package base manufacturing method according to the fourth embodiment of the present invention will be described based on processes PC1 (FIG. 11A) to PC8 (FIG. 12C).

The process PC1 to the process PC4 (FIG. 11A to FIG. 11D) in the fourth embodiment are the same as the process P1 to the process P4 in the first embodiment, and therefore, a description thereof will not be given. It should be noted that the first insulation films 9 are formed at the process PC2.

Figure 11E:
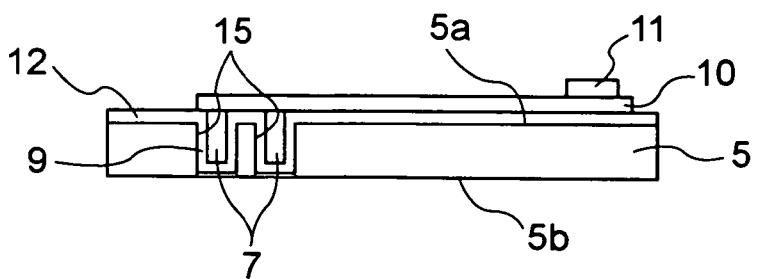

At the process PC5 (FIG. 11E), the lower surface 5b of the base substrate 5 is removed by mechanical grinding or chemical mechanical polishing (CMP), but the mechanical grinding (or chemical polishing) is stopped before the conductive bodies 7 are exposed at the lower surface 5b of the base substrate 5.

At the process PC6 (FIG. 12A), a mask pattern 18 is applied to the lower surface 5b of the base substrate 5 except for the through electrode forming area 8, and the through electrode forming area 8 is dry-etched to form a depression 41 such that the lower surfaces of the conductive bodies 7 of the through electrode unit 4 are exposed at the bottom of the depression 41.

The thickness of the mask pattern 18 is made greater than that of each of the first insulating films 9 so that the lower surface 5b of the base substrate covered with the mask pattern 18 is not etched.

The depression 41 may be formed by laser. The laser can directly form the depression 41 in the lower surface 5b of the base substrate 5 without using the mask pattern 18.

At the process PC7 (FIG. 12B), the mask pattern 18 is removed, and a lower insulating layer 13 and a second insulating film 42, both made of silicon dioxide, are formed on the polished lower surface 5b of the base substrate 5 and on the inner wall of the depression 41, respectively, by CVD. Subsequently, the second insulating film 42 formed at the bottom of the depression 41 is removed by CMP, to expose the lower ends of the conductive bodies 7.

At the process PC8 (FIG. 12C), a pad 35 is formed on the lower surfaces of the conductive bodies 7 exposed at the bottom of the depression 41, by plating, such that the respective conductive bodies 7 are joined with each other. Then, a portion (flat top) of an external terminal 14 is received in the depression 41 such that the external terminal 14 is joined to the pad 35, in a similar manner to the process P5 of the first embodiment.

As a result, the conductive bodies 7, which are embedded in the through holes 6, constitute the through electrode unit 4 in the fourth embodiment. The through electrode unit 4 establishes electrical conduction between the upper surface 5a and the lower surface 5b of the base substrate 5. The slender conductive bodies 7 are joined with each other by the pad 35. Part of the external terminal 14 is fitted in the depression 41 to join the external terminal 14 to the pad 35.

In this way, a wafer having a plurality of package bases 3 is manufactured in the fourth embodiment of the present invention.

The subsequent processes in the case where the package bases 3 are individually used and in the case where the semiconductor package 1 is manufactured using the wafer having the package bases 3 are the same as in the first embodiment of the present invention, and therefore, a description thereof will not be given.

As described above, the fourth embodiment has the same advantages as the third embodiment. In addition, because the depression is formed in the lower surface of the base substrate to expose the lower surfaces of the conductive bodies, the thickness of the base substrate can be increased, and therefore, the strength of the package base can be increased.

The present invention is not limited to the above described and illustrated embodiments. The third and fourth embodiments of the present invention are applied to the through electrode unit according to the first embodiment. However, the same advantages can be obtained when the third and fourth embodiments are applied to the through electrode unit according to the second embodiment.

The through electrode forming area defined in the base substrate has a diameter nearly equal to that of the external terminal in the above described embodiments. However, it is also preferable that the through electrode forming area exists inside the diameter of the external terminal because electrical connection between the external terminal joined to the through electrode unit and all the conductive bodies embedded in the through holes is established more reliably.

In the embodiments of the present invention, the conductive plugs mounted in the semiconductor chips serve as the same through electrodes as the conventional art. However, the conductive plugs mounted in the semiconductor chips can be replaced by the above described through electrode unit of the invention, and the same advantages as in the case of the package base can be obtained.

In this case, preferably the through electrode forming area has a diameter nearly equal to the diameter of the bump formed on the upper surface of the chip substrate having circuit elements thereon. More preferably, the through electrode forming area exists within the bump diameter, and the through electrode unit of the semiconductor chip is formed in the through electrode forming area. It is preferable that the through electrode forming area has a diameter of approximately 90 µm, i.e., the through electrode forming area is three times the size of the slender through holes or the silicon columns.

The embodiments of the present invention have been disclosed for illustrative purposes, and those skilled in the art will appreciate that various changes, modifications, additions and substitutions can be made to the embodiments, without departing from the scope and spirit of the invention as defined in the appended claims.

This application is based on a Japanese Patent Application No. 2005-53918 filed on Feb. 28, 2005 and the entire disclosure thereof is incorporated herein by reference.

What is claimed is:

1. A semiconductor device, comprising:
   a. a package base having a base substrate that is a single layer, that has a first through electrode forming area, and that has a first through electrode formed within the first through electrode forming area and extending through the package base from an upper surface of the package base to a lower surface of the package base to establish electrical conduction between the upper and lower surfaces of the package base, the first through electrode comprising:
      i. a plurality of slender through holes formed in a matrix pattern within the first through electrode forming area and extending through the package base from the upper surface to the lower surface of the package base; and
      ii. a plurality of first conductive bodies filled one each into respective ones of the plurality of slender through holes by plating so that the plurality of first conductive bodies fill the respective ones of the plurality of slender through holes and are arranged in the matrix pattern;
   b. a plurality of semiconductor chips each having a circuit element, said plurality of semiconductor chips being stacked one after another on the upper surface of the package base; and
   c. an external terminal arranged on the lower surface of the package base so that the external terminal is electrically connected to the plurality of first conductive bodies of the first through electrode.

2. The semiconductor device as set forth in claim 1, wherein the base substrate is a silicon substrate.

3. The semiconductor device as set forth in claim 1, wherein the first through electrode consists of:
   i. a plurality of slender through holes formed in a matrix pattern within the first through electrode forming area and extending through the package base from the upper surface to the lower surface of the package base; and
   ii. a plurality of first conductive bodies embedded one each in respective ones of the plurality of slender through holes so that the plurality of first conductive bodies are arranged in the matrix pattern in the first through electrode forming area of the package base.

4. The semiconductor device as set forth in claim 1, wherein the plurality of first conductive bodies are arranged at constant intervals in the first through electrode forming area of the package base.

5. The semiconductor device as set forth in claim 1, wherein each said semiconductor chip has provided therein a second through electrode extending through the semiconductor chip from an upper surface of the semiconductor chip to a lower surface of the semiconductor chip to establish electrical conduction between the upper and lower surfaces of the semiconductor chip, each second through electrode having one chip through hole extending through the semiconductor chip from the upper surface of the semiconductor chip to the lower surface of the semiconductor chip and one second conductive body embedded in the one chip through hole, and each second through electrode being electrically connected to the first through electrode.

6. The semiconductor device as set forth in claim 1, wherein each one of the plurality of slender through holes has a cross-sectional shape which is one of rectangular, square or circular.

7. The semiconductor device as set forth in claim 6, wherein each one of the plurality of slender through holes has a cross-sectional shape which is one of square having a width of 5 to 30 µm or circular having a diameter of 5 to 30 µm.

8. The semiconductor device as set forth in claim 1, further comprising a depression in the lower surface of the package base to expose lower ends of the first conductive bodies.

9. The semiconductor device as set forth in claim 1, wherein each of the plurality of slender through holes in the first through electrode has respective insulating films provided on walls thereof, prior to embedding respective ones of the plurality of first conductive bodies therein, for electrically insulating the plurality of first conductive bodies from the package base.

10. The semiconductor device as set forth in claim 9, wherein the insulating films are comprised of silicon dioxide.

11. The semiconductor device as set forth in claim 1, wherein the first through electrode comprises a plurality of first through electrodes each having a plurality of slender through holes and a plurality of first conductive bodies embedded one each in respective ones of the plurality of slender through holes, and wherein the external terminal is a plurality of external terminals arranged on the lower surface of the package base so that each external terminal of the plurality of external terminals is electrically connected to one first through electrode of the plurality of first through electrodes via the plurality of first conductive bodies thereof respectively.

12. The semiconductor device as set forth in claim 1, wherein the base substrate consists of silicon.

13. A semiconductor device, comprising:
   a. means for supporting a chip stack which is a package base having a base substrate that is a single layer, that has a plurality of first through electrode forming areas, and that has a plurality of first through electrodes formed in a matrix pattern within respective first through electrode forming areas and extending through the package base from an upper surface of the package base to a lower surface of the package base to establish electrical conduction between the upper and lower surfaces of the package base, each first through electrode of the plurality of first through electrode being comprised of:
      i. a plurality of slender through holes formed in a matrix pattern within a respective first through electrode forming area and extending through the package base from the upper surface to the lower surface of the package base; and
      ii. a plurality of first conductive bodies filled one each into respective ones of the plurality of slender through holes by plating so that the plurality of first conductive bodies fill the respective ones of the plurality of slender through holes and are arranged in the matrix pattern;
   b. a chip stack comprised of a plurality of semiconductor chips each having a circuit element, said plurality of semiconductor chips being stacked one after another on the upper surface of the package base; and c. a plurality of external terminals arranged on the lower surface of the package base so that each external terminal of the plurality of external terminals is electrically connected to one first through electrode of the plurality of first through electrodes via the plurality of first conductive bodies thereof.

14. The semiconductor device according to claim 13, wherein each first through electrode of the plurality of first through electrodes consists of:
  i. a plurality of slender through holes formed within a respective first through electrode forming area in a matrix pattern and extending through the package base from the upper surface to the lower surface of the package base; and
  ii. a plurality of first conductive bodies embedded one each in respective ones of the plurality of slender through holes.

15. The semiconductor device according to claim 13, wherein each first through electrode of the plurality of first through electrodes is arranged at a constant interval from one another.

16. The semiconductor device according to claim 13, wherein each semiconductor chip includes a second through electrode extending through the semiconductor chip from an upper surface of the semiconductor chip to a lower surface of the semiconductor chip to establish electrical conduction between the upper and lower surfaces of the semiconductor chip, wherein each second through electrode includes one chip through hole extending through the semiconductor chip from the upper surface of the semiconductor chip to the lower surface of the semiconductor chip and one conductive body embedded in the one chip through hole, and wherein each second through electrode is electrically connected to one first through electrode.

17. The semiconductor device according to claim 13, wherein each one of the plurality of slender through holes has a cross-sectional shape which is one of rectangular, square having a width of 5 to 30 μm, or circular having a diameter of 5 to 30 μm.

18. The semiconductor device according to claim 13, further comprising a plurality of depressions in the lower surface of the package base to expose lower ends of the respective first conductive bodies of respective first through electrodes.

19. The semiconductor device according to claim 13, wherein each first through electrode of the plurality of first through electrodes consists of;
  i. a plurality of slender through holes formed within a respective first through electrode forming area in a matrix pattern and extending through the package base from the upper surface to the lower surface of the package base;
  ii. insulating films provided on respective walls of each of the plurality of slender through holes; and
  iii. a plurality of first conductive bodies embedded one each in respective ones of the plurality of slender through holes,
  wherein the insulating films electrically insulate the plurality of first conductive bodies from the package base.

20. The semiconductor device according to claim 19, wherein the insulating films are comprised of silicon dioxide.

* * * * *